United States Patent
Blue et al.

(10) Patent No.: US 8,210,420 B1
(45) Date of Patent: Jul. 3, 2012

(54) COMPOSITE BIAXIALLY TEXTURED SUBSTRATES USING ULTRASONIC CONSOLIDATION

(75) Inventors: Craig A. Blue, Knoxville, TN (US); Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/020,032

(22) Filed: Feb. 3, 2011

(51) Int. Cl.
*B23K 1/06* (2006.01)
(52) U.S. Cl. .................. 228/110.1; 228/111; 228/1.1
(58) Field of Classification Search ............. 228/110.1, 228/1.1, 111
See application file for complete search history.

(56) References Cited

U.S. PATENT DOCUMENTS

| 6,375,768 B1 | 4/2002 | Goyal |
| 2009/0114274 A1 * | 5/2009 | Fritzemeier .................. 136/255 |

* cited by examiner

*Primary Examiner* — Jessica L Ward
*Assistant Examiner* — Erin Saad
(74) *Attorney, Agent, or Firm* — Joseph A. Marasco

(57) ABSTRACT

A method of forming a composite sheet includes the steps of: providing a first sheet having a surface and including a metal or alloy, the first sheet having a given strength characteristic; providing a second sheet having a surface and a strength characteristic that is superior to the given strength characteristic of the first sheet; disposing the first sheet and the second sheet in an aligned opposing position with at least a portion of the surface of the first sheet touching the surface of the first sheet to form a contact area; and bonding the first sheet to the second sheet at least in part by applying an oscillating ultrasonic force to at least one of the first sheet and the second sheet to form a composite sheet, the first sheet having a cube texture characterized by a $\phi$-scan having a FWHM of no more than 15° in all directions.

22 Claims, 19 Drawing Sheets

COMPOSITE BIAXIALLY TEXTURED SUBSTRATES USING ULTRASONIC CONSOLIDATION

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

BACKGROUND OF THE INVENTION

For high temperature superconductivity applications, biaxially textured substrates which are mechanically strong, having a yield strength of greater than three hundred megapascals and having reduced magnetism (Curie temperature less than 65K and reduced saturation magnetism) are desirable. Substrates made of nickel-tungsten alloys are a popular choice for this superconductivity application. However, it is difficult to achieve the desired texture and the desired strength. One way to make a stronger and less magnetic material for the substrate is to make a composite. For example, see U.S. Pat. No. 6,375,768. However, when using this process, there are always trade-offs between the amount of pressure and heat that may be used during the bonding process and the object of retaining good crystallization texture.

One way to make a stronger and less magnetic material than Ni-5-6 at % W is to make a composite, as taught in U.S. Pat. No. 6,375,768, the entire disclosure of which is incorporated herein by reference. A thermomechanical lamination in the final stage of the rolling process is followed by optional further rolling and then annealing to form a desirable primary recrystallization texture.

SUMMARY OF THE INVENTION

In accordance with some examples of the present invention, a method of forming a composite sheet includes the steps of: providing a first sheet having a surface and including a metal or alloy having a cube texture characterized by a φ-scan having a full width at half maximum (FWHM) of no more than 15° in all directions, the first sheet having a given strength characteristic; providing a second sheet having a surface and a strength characteristic that is superior to the given strength characteristic of the first sheet; disposing the first sheet and the second sheet in an aligned opposing position with at least a portion of the surface of the first sheet touching the surface of the first sheet to form a contact area; and bonding the first sheet to the second sheet at least in part by applying an oscillating ultrasonic force to at least one of the first sheet and the second sheet to form a composite sheet without deleteriously affecting the cube texture of the first sheet.

In accordance with further examples of the present invention, a method of forming a composite sheet includes the steps of: providing a first sheet having a surface and including an untextured metal or alloy; providing a second sheet having a surface; disposing the first sheet and the second sheet in an aligned opposing position with at least a portion of the surface of the first sheet touching the surface of the first sheet to form a contact area; bonding the first sheet to the second sheet at least in part by applying an oscillating ultrasonic force to at least one of the first sheet and the second sheet to form an untextured intermediate composite sheet; and annealing the untextured intermediate composite sheet at a temperature lower than a primary re-crystallization temperature of the second sheet and higher than a primary re-crystallization temperature of the first sheet to convert the untextured first sheet into a cube textured sheet, wherein the cube texture is characterized by a φ-scan having a FWHM of no more than 15° in all directions, the second sheet remaining untextured, to form a composite sheet.

Figure 1:
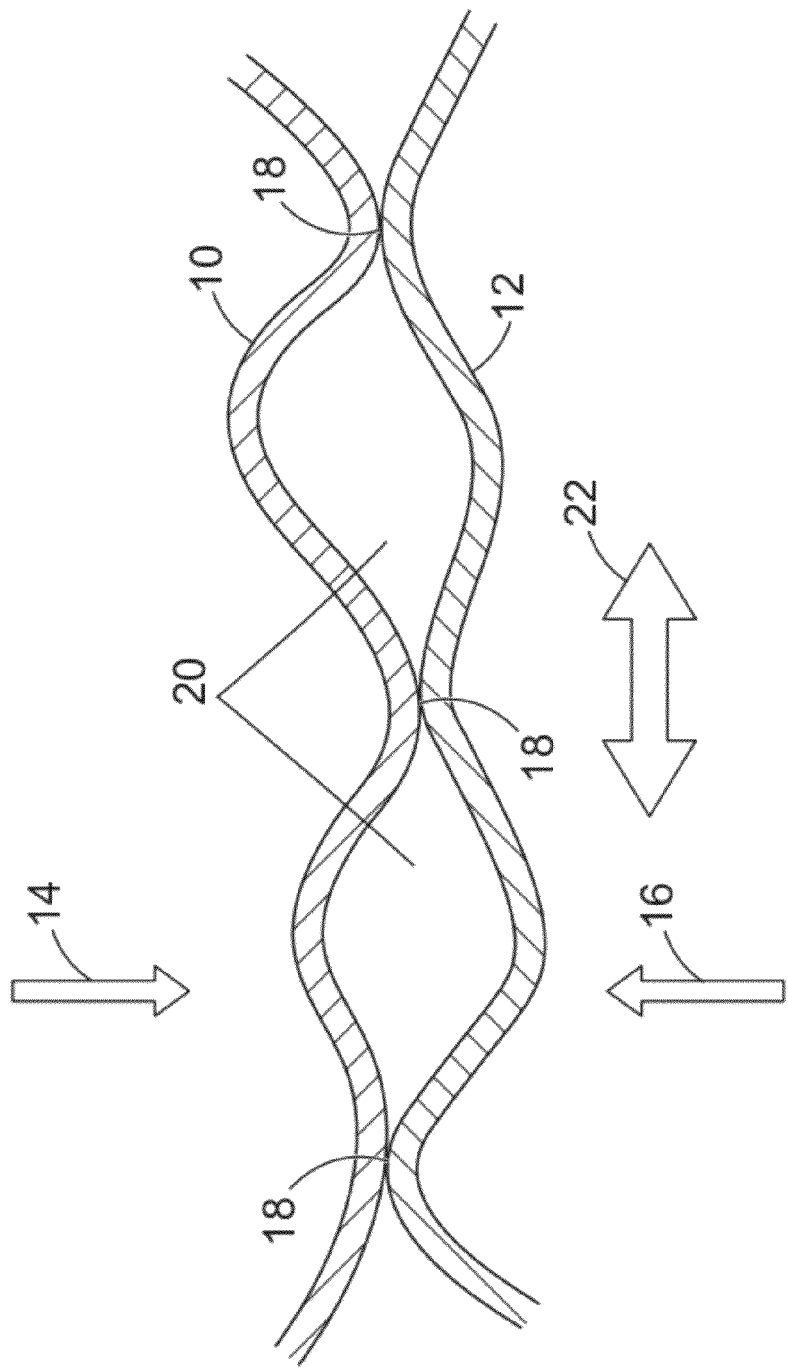
FIG. 1 is a diagram of two surfaces of metal sheets being pressed together in accordance with examples of the present invention.

For a better understanding of the present invention, together with other and further objects, advantages and capabilities thereof, reference is made to the following disclosure and appended claims in connection with the above-described drawings.

DETAILED DESCRIPTION OF THE INVENTION

Thermomechanical lamination processes can require significant deformations to form a good bond. The present invention provides an improved method of fabricating laminated, composite structures using ultrasonic consolidation. (For purposes of describing the present invention, the term consolidation can be used interchangeably with the terms bonding, joining and/or welding). The process uses a high frequency ultrasonic energy source to induce combined static and oscillating shear forces within metal sheets (also called foils, strips, tapes, and/or ribbons, for example) to produce solid state bonds.

A laminated composite sheet can be formed using at least ultrasonic bonding to cause bonding between two or more sheets. Ultrasonic bonding uses a high frequency ultrasonic energy source to induce combined static and oscillating sheer forces within metal foils to produce solid state bonds and form a composite sheet.

A first metal sheet can have a cube texture characterized by a $\phi$-scan having a FWHM of no more than 15° in all directions, preferably no more than 7° in all directions. The first sheet has a given strength characteristic that is generally common to cube textured materials. The first metal sheet can comprise an alloy that includes Ni, Fe, Al, Cu, or a combination of any of the foregoing, for example.

A second sheet has a strength characteristic that is superior to the given strength characteristic of the first sheet and can be non-magnetic. The second sheet can comprise Ni, a Ni-alloy, Cu, a Cu-alloy, Al, an Al-alloy, or a combination of any of the foregoing, for example.

The first and second sheets are positioned in an aligned and opposing position with at least a portion of a surface of the first sheet touching the surface of the second sheet to form a contact area. A first normal force is applied to the first sheet and a second, opposing normal force is applied to the second sheet to press the sheets together at the contact area. In this context, the word "normal" means substantially perpendicular to the orientation of the sheets. For example, a roller may provide the first normal force and a roller, an anvil or a plate, may provide the second normal force.

While the normal forces are being applied, an oscillating ultrasonic force is simultaneously applied to one of the sheets. The oscillating force is oriented to cause sheer forces and interfacial stress in the sheets at the contact area. The magnitude and duration of the first and second normal forces and the oscillating force are chosen to be sufficiently large to cause bonding between the first and second sheets in the contact area and to form a composite sheet.

The magnitude and duration of the first and second normal forces, and oscillating force are preselected to cause bonding between the sheets but to substantially avoid changing the sharp cube texture of the first sheet. Thus after bonding with the second sheet, the first sheet maintains a cube texture characterized by a $\phi$-scan having a FWHM of no more than 15° in all directions, preferably no more than 7° in all directions.

The composite sheet may be annealed at a temperature higher than the primary re-crystallization temperature of the first and second sheet to improve bonding between the first and second sheets, to improve the cube texture of the first sheet, and/or to form a cube texture in the first sheet characterized by a $\phi$-scan having a FWHM of no more than 15° in all directions, preferably no more than 7° in all directions. The annealing process may be accomplished by providing annealing heat through a variety of sources including resistive, radiative, contact, plasma-arc, and high density infrared.

The first sheet may be untextured, and become textured via the process of the present invention. Moreover, the sheet may be cube textured, the process of bonding reduces the texturing, and then the process of annealing restores and optionally improves the texture.

The oscillating ultrasonic force applied to the first sheet can be applied, for example, at an amplitude of 15-25 microns and at a normal force of 1000-2500N. Moreover, for example, a rotating roller sonotrode can be used to apply the ultrasonic force to the first sheet. The magnitude and duration of the oscillating force are preselected to be sufficient to break up any oxide layers that may be present on at least the surface of first sheet. By breaking up such oxide layers, the oscillating forces facilitate and/or enhance bonding between the sheets.

A third sheet may be bonded to the opposite side of the second sheet such that the second sheet is positioned between the first and third sheets. The third sheet may have the same or similar properties as the first layer.

One or more epitaxial layers may be applied to the first and/or second and/or third sheets of the composite sheet. At least one of such layers can be a superconducting layer.

Referring now to the drawings, in which like referenced characters designate like or corresponding parts throughout the several views, there is shown in FIG. 1 a cross-sectional side-view illustration of two sheets 10, 12 that are being bonded together by pressure. Thickness of the sheets 10, 12 and undulations thereof are exaggerated for illustration purposes. Opposing normal forces indicated by arrows 14, 16 are applied to the sheets 10, 12 to press them together, and the sheets engage at contact areas 18 leaving voids 20 between the contact areas 18. Simultaneously, an oscillating, transverse force, indicated by double arrow 22 is applied to the sheets 10, 12 in accordance with the present invention. Although two sheets 10, 12 are shown, the method of the present invention can be used to bond a plurality of sheets in like manner, as will be described hereinbelow.

Figure 2:
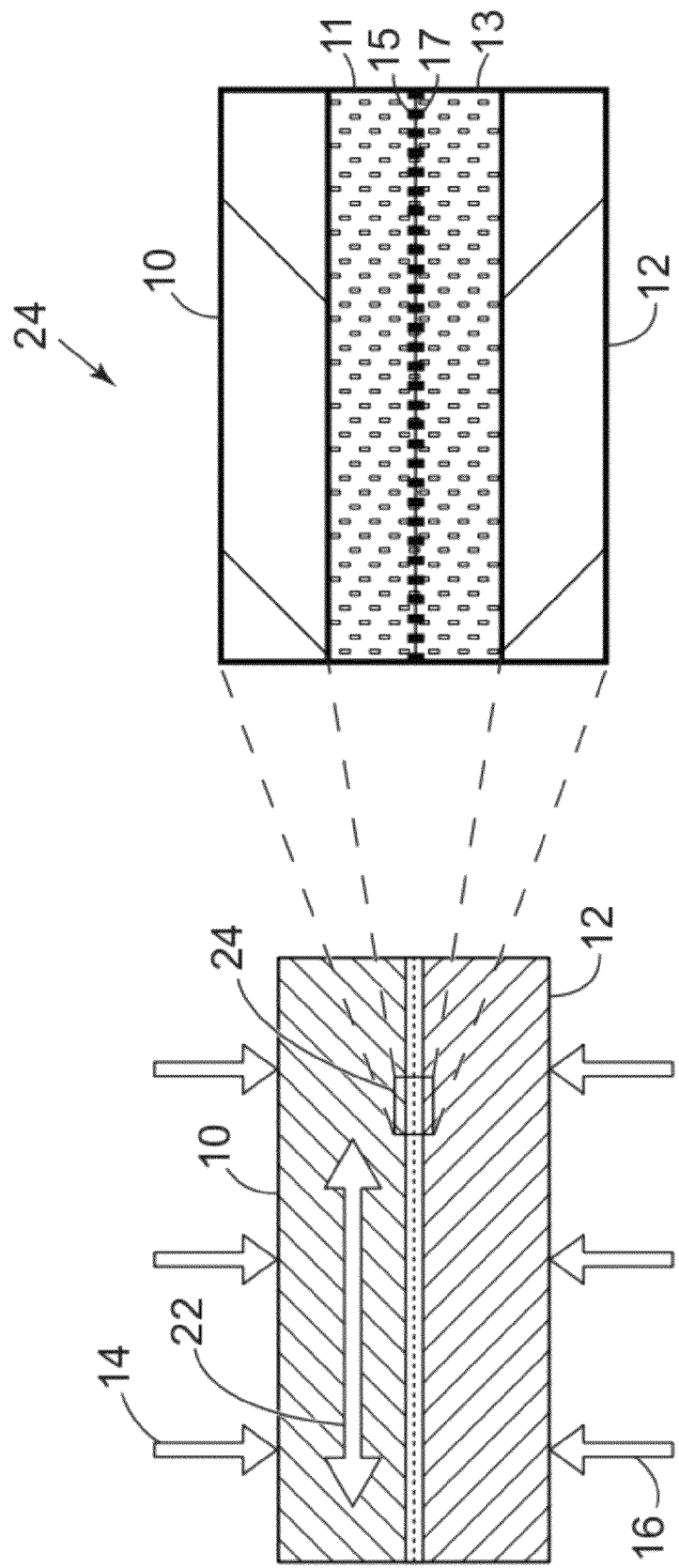
FIG. 2 is a diagram of two metal sheets being bonded together by normal forces and oscillation forces in accordance with examples of the present invention.

The process of bonding between two sheets in accordance with examples of the present invention is further illustrated in FIG. 2, which shows a cross-sectional, magnified view of sheets 10, 12 as they are bonded. A downwardly directed normal force 14 is applied to sheet 10 and an upwardly directed normal force 16 is applied to sheet 12. Simultaneously with the application of the normal forces, an oscillating ultrasonic force 22 is applied through sheet 10 and the oscillation force 22 cause sheer forces at the intersection of the two sheets 10, 12.

Referring again to FIG. 2, further magnified section 24 graphically illustrates the process that is occurring at the intersection of the two sheets 10, 12. As the sheets 10, 12 are pressed together by the normal forces 14, 16 (and optionally heated), layers of plastic metal 11, 13 each having a thickness of up to 20 µm are formed in the respective sheets 10, 12 just below the surface of the sheets 10, 12, which are normally covered with a respective surface oxide 15, 17. The oscillating force 32 urges the sheets 10, 12 in directions generally parallel to the sheets 10, 12. For example, the oscillating force 32 will generally tend to move the sheet 10 while the sheet 22 is held stationary. The skilled artisan will recognize that the oscillating force 32 may also tend to move the sheet 22 while the sheet 20 is held in place. Moreover, the oscillating force 32 may further tend to simultaneously move both sheets 10, 12 in the same or in different directions.

The combination of normal forces 14, 16 and oscillating force 32 creates stresses between the sheets 10, 12, and the stresses produce cracks in the brittle surface oxide layers 25, 17 as well as induce plastic deformation in the thin layers of plastic metal 11, 13. The thin layer of plastic metal may have a thickness of up to 20 microns and is located just beneath the oxide layer. Plastic deformation itself can cause further cracking in the oxide layers 15, 17. As this happens, nascent plastic metal 11, 13 from beneath the oxide layers 10, 12 extrudes through the cracks in the oxide layers 10, 12 causing disintegration of the oxide layers into smaller pieces which are disbursed in the vicinity of the bond zone by metal flow. This process generates atomically clean metal surfaces and brings them into intimate contact establishing a metallurgical bond.

Multiple bonding points 58 are being formed but they are separated by gaps 60 which are maintained by the oxide on the sheets 52 and 54. However, through the previously described process of oxide layer break-up, plastic deformation and atomic diffusion, the gaps 60 are displaced by more bonding points 58 until the gaps are substantially minimized or eliminated.

This first stage is then followed by repetitive similar stages. As the process continues, the bonded regions grow in size aided by plastic deformation and diffusion. In the region of the original voids 30, the oxide layers 24 and 26 remain, but the bonding process continues and the oxide layers are continued to be destroyed. Again, plastic deformation at the bonded regions results in squeezing of metal into the voids 30, which creates mating surfaces across the void regions approach. As this happens, new points come into contact and bonding occurs. Continued application of ultrasonic oscillating energy results in friction, continued oxide layer break-up and bonding across the new contact points in the manner described above. Each bonding stage can be followed by another bonding stage and ultimately the ultrasonic welding process creates a substantially continuous weld between the surfaces.

In general, the higher the number of these stage repetitions during ultrasonic welding, the better will be the bonding between the mating surfaces. However, if the material is prone to hardening under these conditions, a threshold can be reached above which the bonding between the mating surfaces will begin to degrade.

Figure 3:
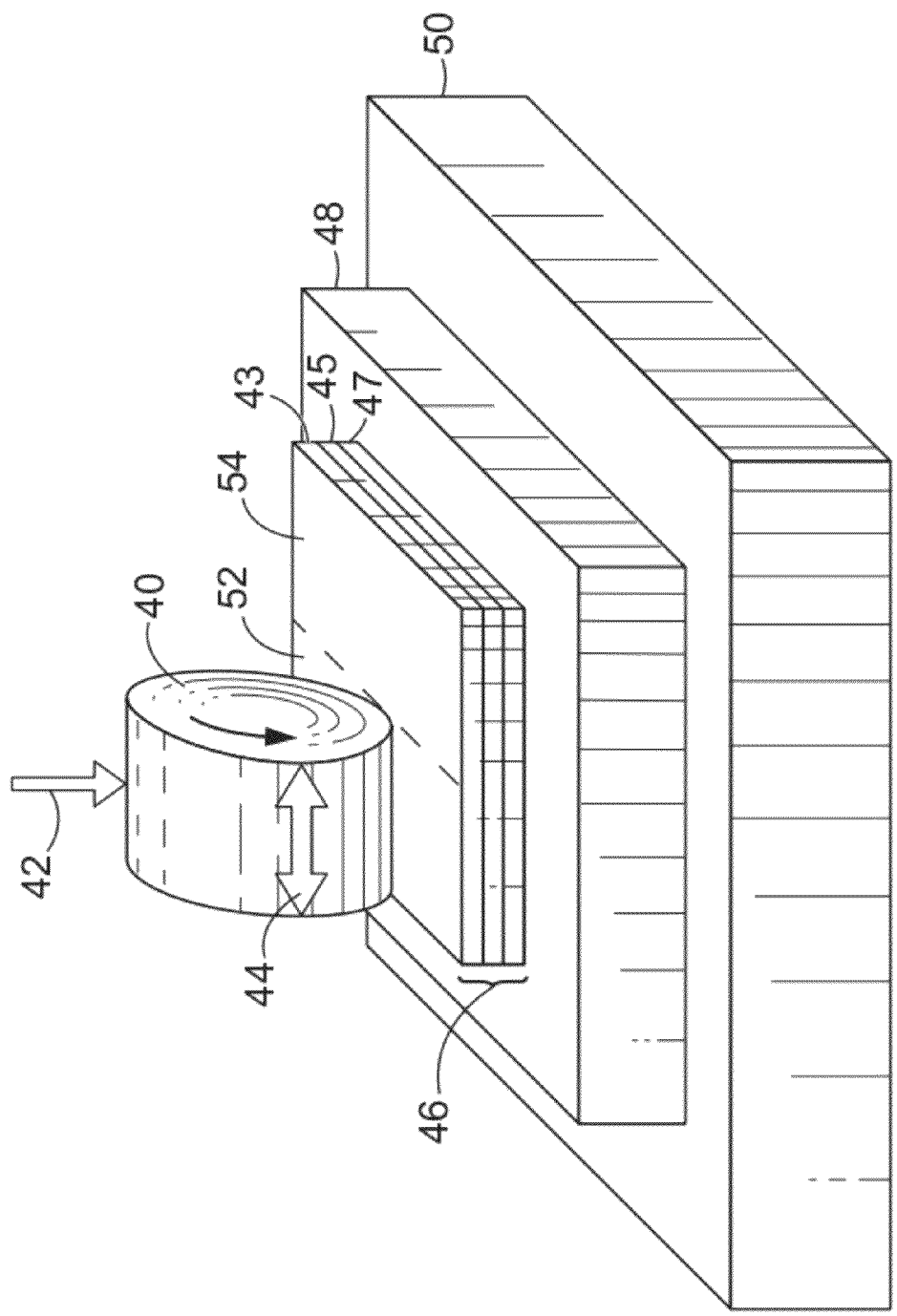
FIG. 3 is an isometric diagram of a three metal sheets being pressed together by a roller press on a base plate in accordance with examples of the present invention.

FIG. 3 is an isometric illustration of a rotating roller sonotrode 40 being used to bond layers 43, 45, 47 of a laminated (composite) article 46. Below the laminated article 46 is a supporting plate 48 and heated anvil 50. The heated anvil 50 provides annealing heat that is transmitted upwardly through the base plate 48 and into the laminated article 46 and thereby facilitates bonding of layers 43, 45, 47.

The rotating roller sonotrode 40 applies a downward normal force 42 and an oscillating force 44 to the laminated article 46. Downward force 42 is countered by an upward force of static base plate 48. The rotating roller sonotrode 40 rolls over the laminated article 46 and creates bonding between the layers 43, 45, 47 of the laminated article 46. In this particular example of the present invention, a laminated article 46 is being bonded and the rotating roller sonotrode 40 is narrower than the laminated article 46. Hence, the rotating roller sonotrode 40 must bond separate regions 52, 54 of the laminated article 46 separately. As shown in FIG. 3, the rotating roller sonotrode 40 is bonding the left side 52 of the laminated article 46 and will subsequently move laterally and bond the remaining section 54 of the laminated article 46 in like manner.

Figure 4:
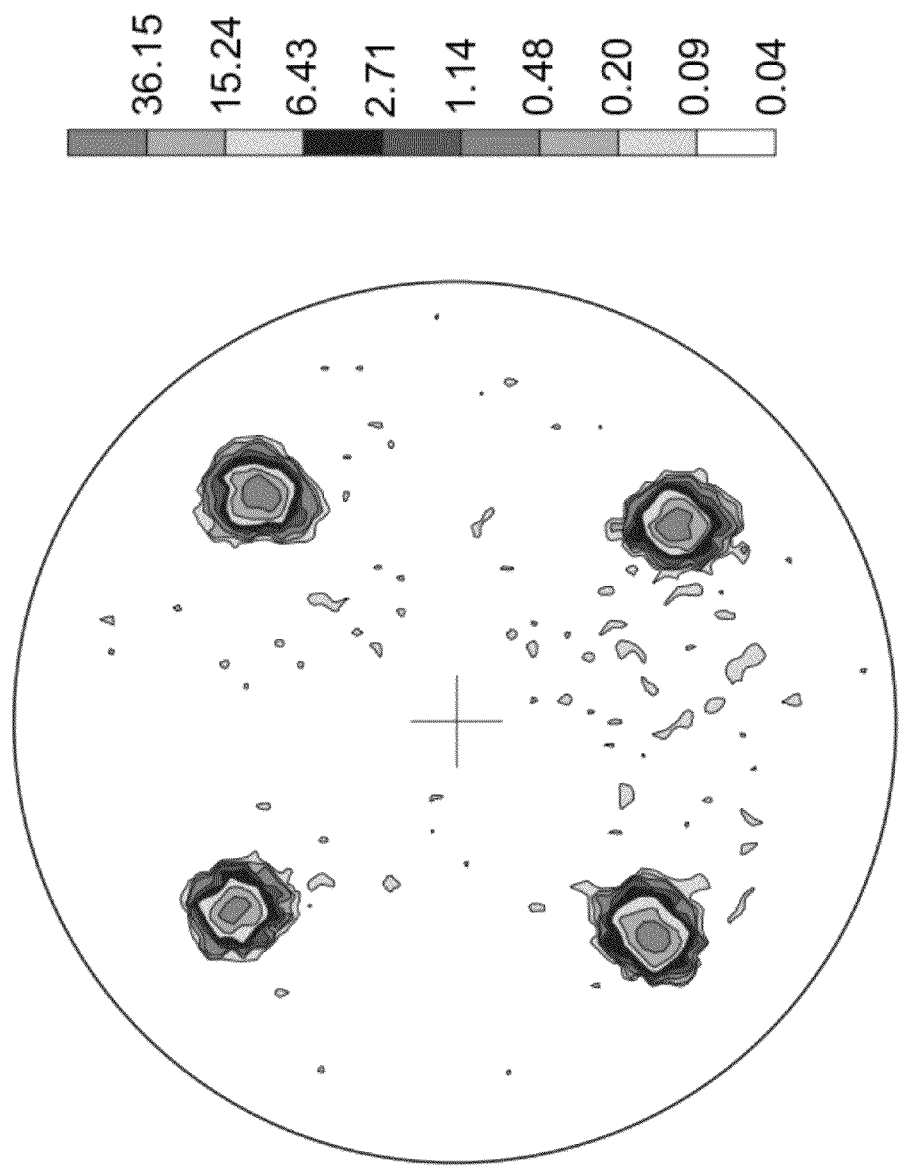
FIG. 4 is a (111) pole figure of a fully and sharply cube-textured Cu sheet.

FIG. 4 is a pole figure showing cube texture in a sample of copper metal, which is highly desirable for some applications. Some cube textured substrates such as copper undergo secondary re-crystallization with the application of heat. For example, if a cube textured copper sheet is heated to temperatures above 100° centigrade, the cube texture is lost and secondary re-crystallized components appear. This destruction of cube texture is not favorable and in substrates which do undergo secondary re-crystallization, the normal force applied during bonding may be detrimental and result in modification of the cube texture in the copper sheet. However, by the application of ultrasonic energy as described above, the normal forces may be kept sufficiently low to avoid destroying the desired cube texture of the copper sheet.

The skilled artisan will recognize that in examples of the invention involving materials that do not undergo secondary re-crystallization, such as cube textured nickel, there is more flexibility in the use of both normal forces and oscillating ultrasonic forces when the sheets are being bonded. Even in this case, the application of ultrasonic oscillating force accelerates the process of bonding and helps to prevent the loss of desired texture, needed in many applications to support electrically active materials such as, for example, superconductors, semiconductors, ferroelectrics, photovoltaics, and the like.

Figure 5:
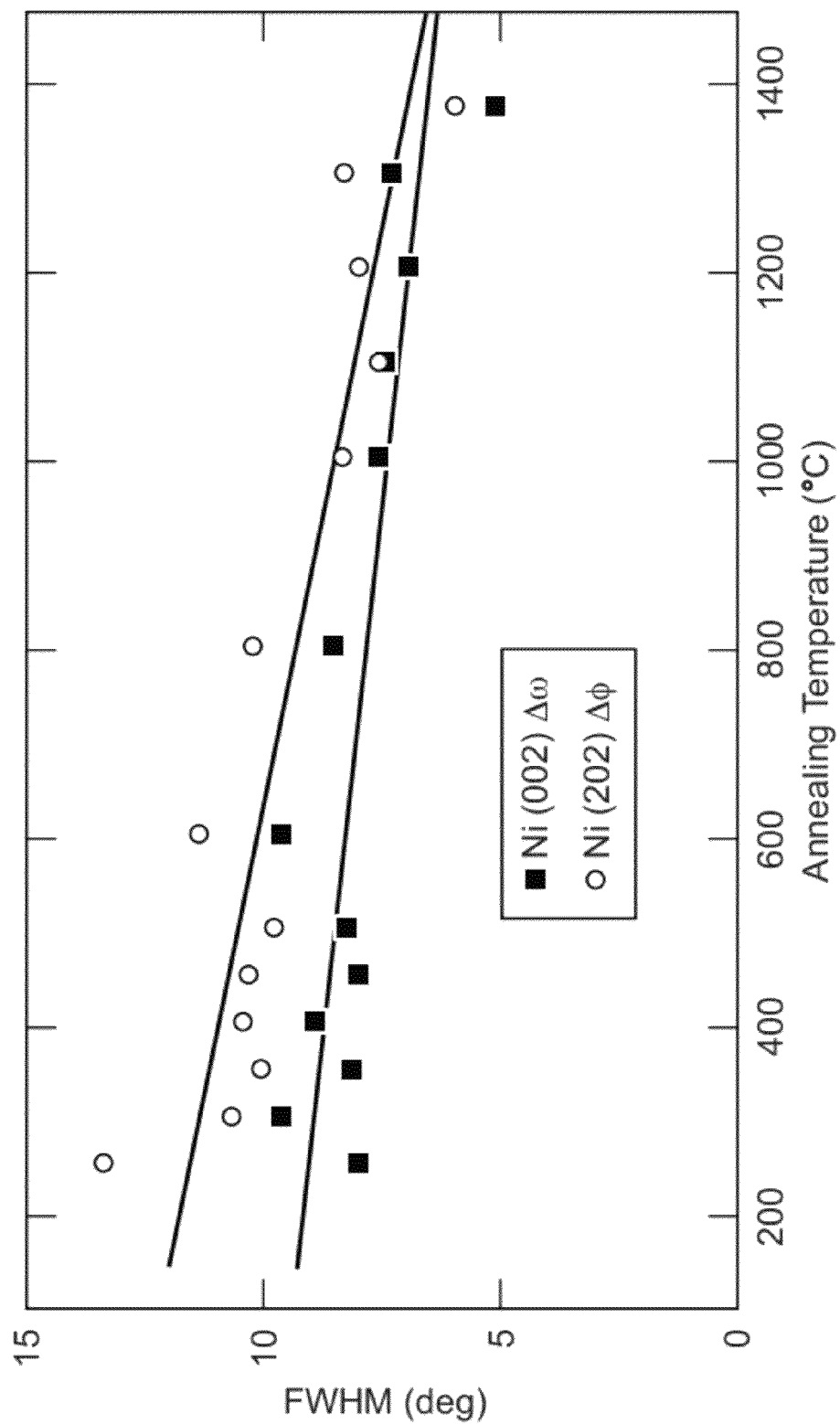
FIG. 5 is a graph showing annealing temperature versus texture sharpness.
Figure 6:
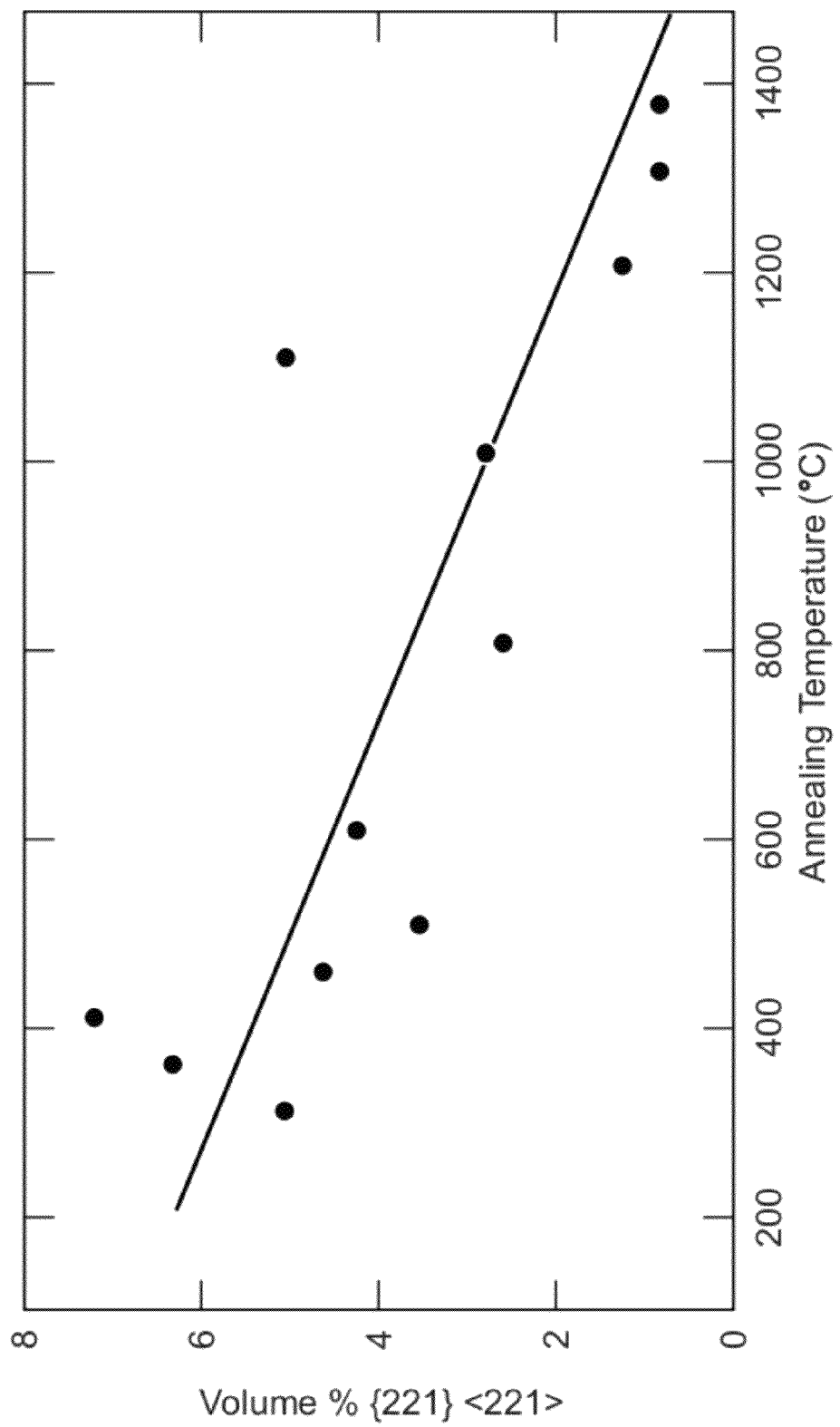
FIG. 6 is a graph showing annealing temperature versus grained volume.
Figure 7:
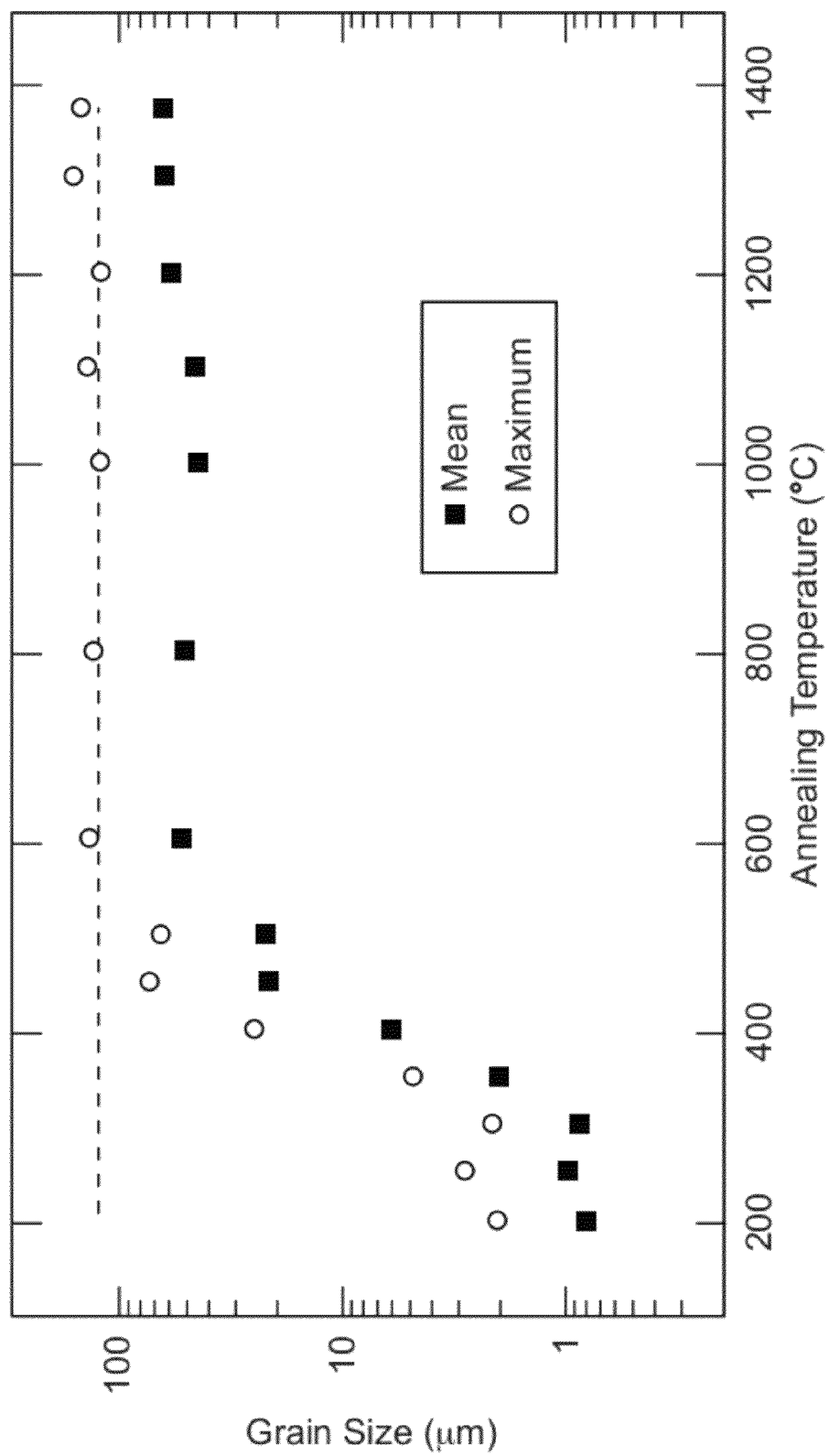
FIG. 7 is a graph showing annealing temperature versus grain size.

Referring to FIGS. 5-7, the characteristics of a nickel sheet are shown. In FIG. 5, the sharpness shown in FWHM continues to improve with the annealing temperature all the way to the melting point of nickel. At the same time, the number of $\Sigma 3$ twin boundaries decrease as shown in FIG. 6. As the grain size grows, it reaches the thickness of the sheet as shown in FIG. 7 and saturates. Typically, materials such as nickel, for example, do not undergo secondary re-crystallization.

Figure 8:
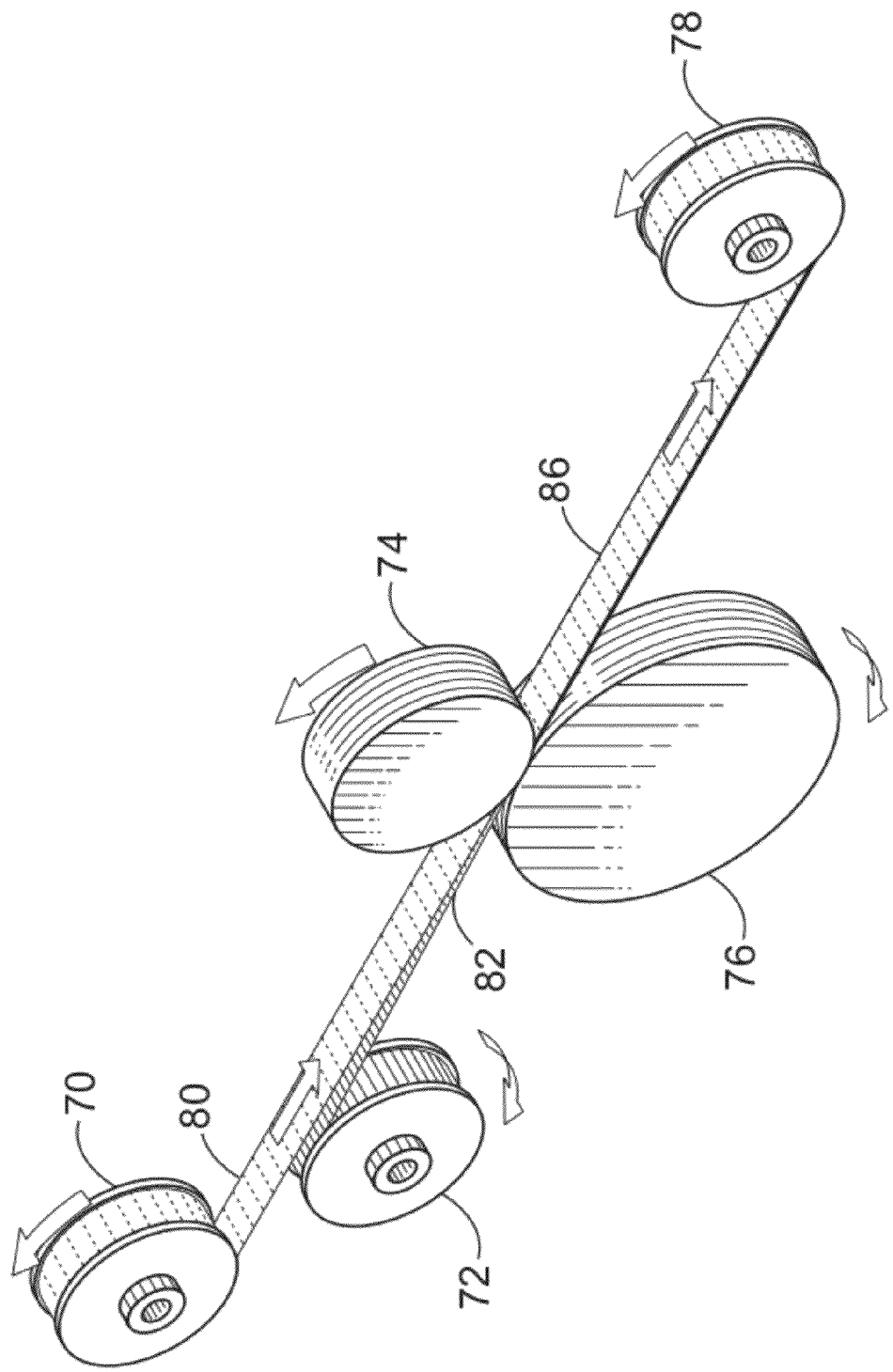
FIG. 8 is a diagram showing a rotating sonotrode bonding together two sheets in accordance with examples of the present invention.

Referring now to FIG. 8, in accordance with examples of the present invention, a schematic diagram is shown illustrating a process for creating long continuous sheets (can also be called foils, strips, tapes, and/or ribbons, for example) of bonded composite sheets using ultrasonic energy. In this case, two materials are provided by first and second pay-out spools 70, 72. For example, the first pay-out spool 70 can provide a first sheet 80 comprising a low strength, highly textured material, and the second pay-out spool 72 can provide a second sheet 82 comprising a non-textured high strength material. Sheets 80, 82 are combined, pressed together, and bonded by the rotating sonotrode 74 that compresses sheets 80, 82 against a base roller 76 to form a product composite sheet 86. The base roller 76 can be heated via integral or external means to assist in bonding the sheets 80, 82. The bonded product composite sheet 86 is collected on a take-up spool 78.

In some examples of the invention, the rotating sonotrode 74 applies downward normal force in a range of 1000N to 2500N and provides an oscillating force with an amplitude in the range of 15 microns to microns. The sheets 80, 82 are fed through the rollers 74, 76 at a feed rate in a range of 20 to 200 inches per minute (ipm). The foregoing force densities and other parameters can vary depending upon various factors. Such factors can include, but not limited to: composition and thickness of the sheets 80, 82, composition and physical characteristics of the rollers 74, 76, and variations in the parameters described hereinabove within the stated ranges.

EXAMPLE I

A first sheet 80 comprising a biaxially textured nickel-tungsten alloy is bonded to a second sheet 82 comprising type 316 stainless steel. The rotating sonotrode 74 applies downward normal force of 1000-2500N and provides an oscillating force with an amplitude in the range of 15-25 microns. The sheets 80, 82 are fed through the rollers 74, 76 at a feed rate of approximately 20 ipm.

Figure 9:
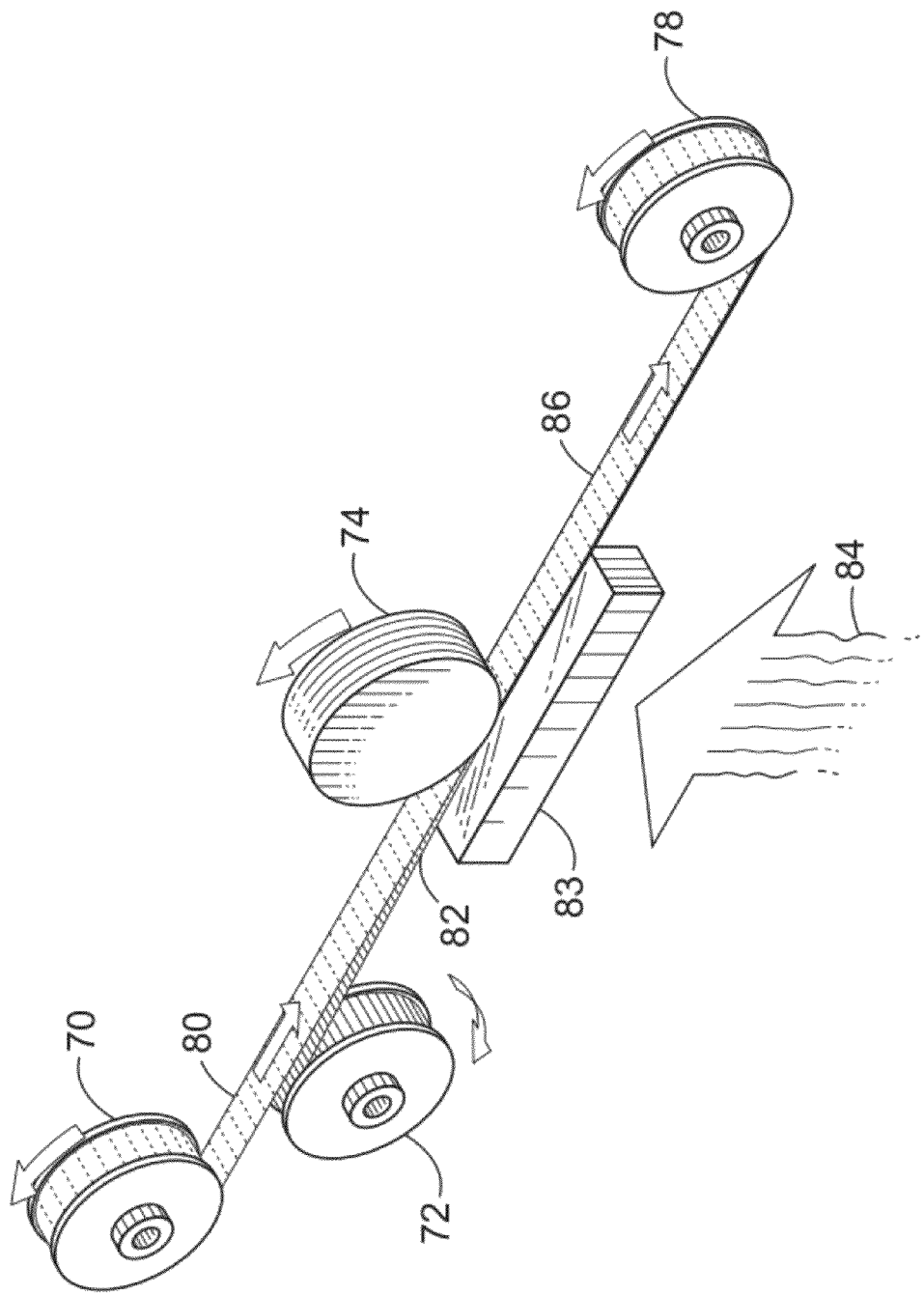
FIG. 9 is a diagram of a rotating sonotrode bonding sheets together using radiative heating and a base plate in accordance with examples of the present invention.

FIG. 9 illustrates another example of the present invention, similar to that shown in FIG. 8, with a few differences. A base plate 83 is used instead of a base roller. The base plate 83 is optionally heated by radiative heating 84.

Figure 10:
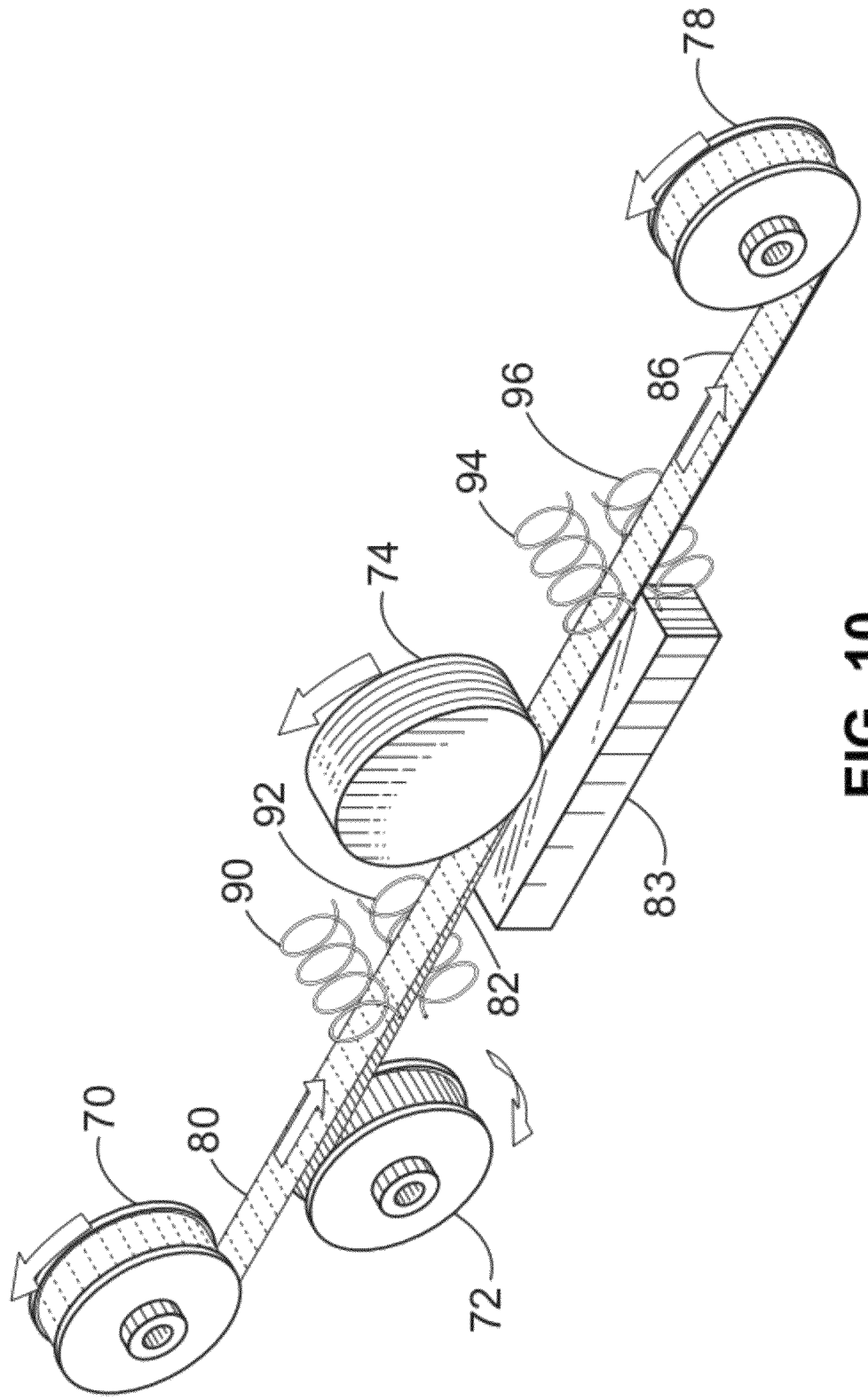
FIG. 10 is a diagram of a rotating sonotrode bonding two sheets together using resistive heating both before and after the bonding forces are applied.

FIG. 10 illustrates another example of the present invention, similar to those shown in FIGS. 8, 9, with further differences. A first pair of resistive heaters 90, 92 is provided above and below the sheets 80, 82, and between the payout spools 70, 72 and the rotating sonotrode 74. Resistive heaters 90, 92 preheat the sheets 80, 82 in order to enhance the bonding process. Moreover, a second pair of resistive heaters 94, 96 is provided above and below the bonded laminate sheet 86, and between the rotating sonotrode 74 and the take-up spool 78. The bonded laminate sheet 86 is subjected to post-bonding heating by heaters 94, 96 to p a desired annealing effect on the bonded laminate sheet 86. The annealing effect can cause secondary re-crystallization and in some materials such re-crystallization will result in improved, sharper texture.

Figure 11:
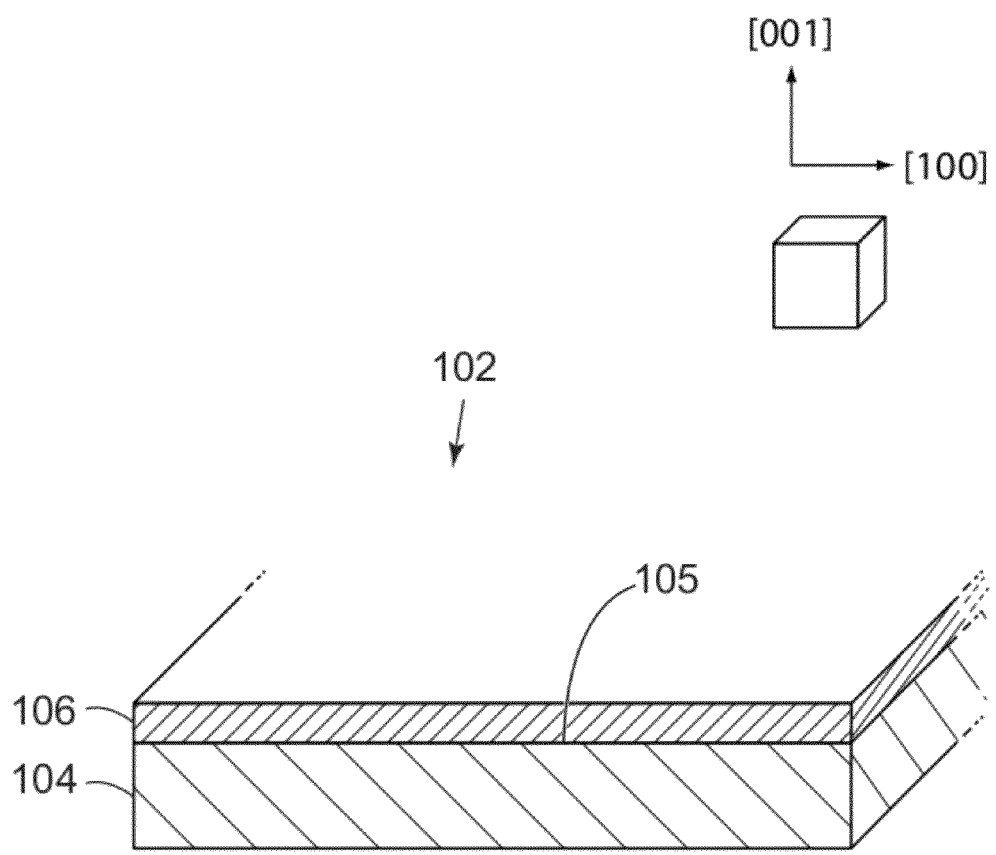
FIG. 11 is a diagram of a composite sheet having an untextured layer and a sharply textured layer, in this case a cube textured surface.

Referring now to FIG. 11, there is shown a cross-sectional view of a two layered composite sheet 102 that includes an untextured sheet 104 having bonded to a surface thereof 105 a cube textured sheet 106. A cube texture crystallographic orientation key is shown as an inset. The un-textured sheet 104 may be constructed of Hastelloy (registered trademark name of Haynes International, Inc., Komoko, Ind.) a stainless steel, or other alloy which is a strong material, and the cube textured sheet 106 may be constructed of NiW or Cu which is a material that retains its texturing well even in the presence of high pressure and heat. In this particular embodiment, untextured sheet 104 has a thickness of 25-50 microns and cube textured sheet 106 has a thickness of 10-50 microns; thus the composite sheet 102 has a thickness of 35-100 microns.

Figure 12:
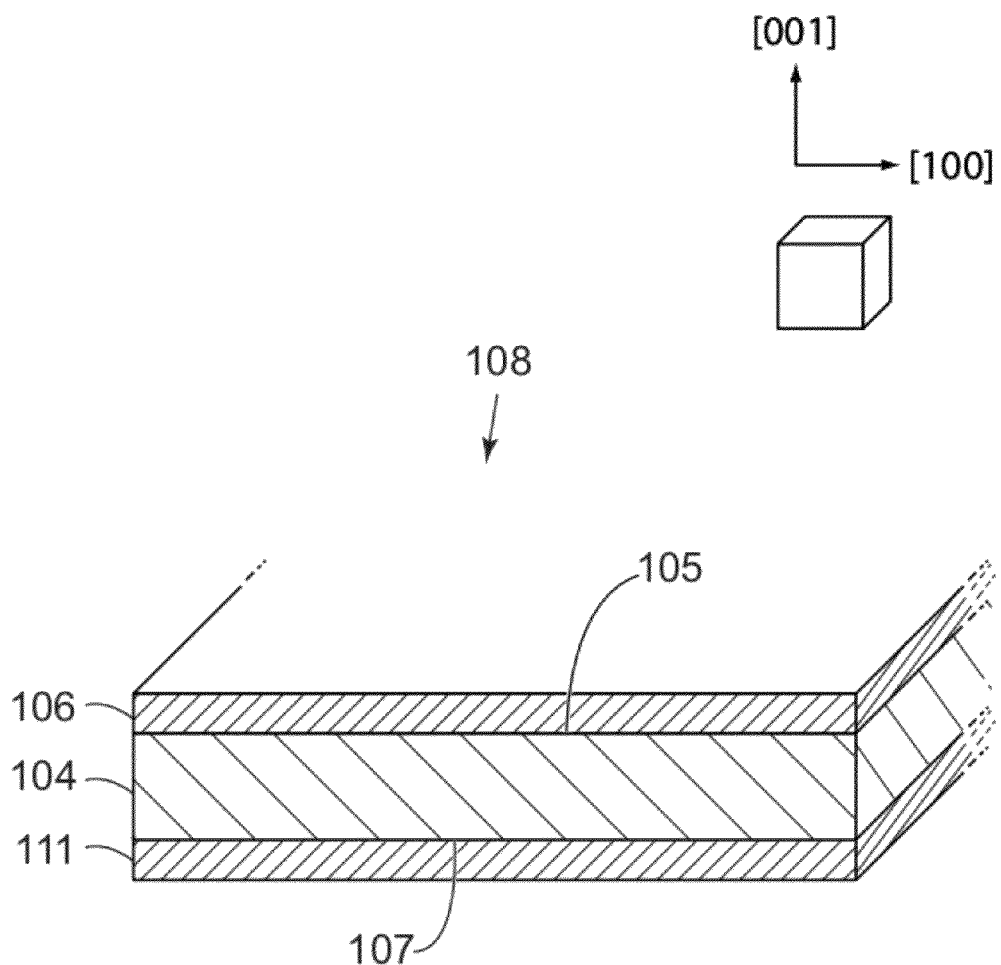
FIG. 12 is a diagram of a composite sheet having two outside cube textured surfaces and a center un-textured sheet.

FIG. 12 shows in accordance with examples of the present invention, a composite sheet 108 has an additional textured sheet 111 bonded to another surface 107 of the untextured sheet 104. Thus, the untextured sheet 104 is sandwiched between textured sheets 106 and 111. In some applications, this may be a desirable configuration since the stress state of the material will be such that it will remain straight as bonded and when heated for subsequent processing.

Figure 13:
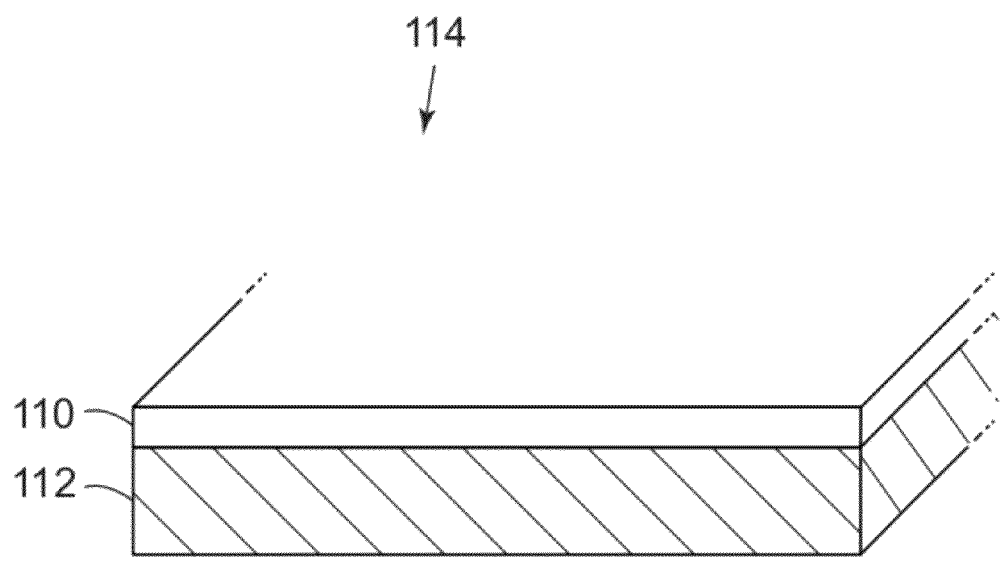
FIG. 13 is a diagram of an article before re-crystallizing by annealing and forming a cube textured surface on a composite sheet.
Figure 14:
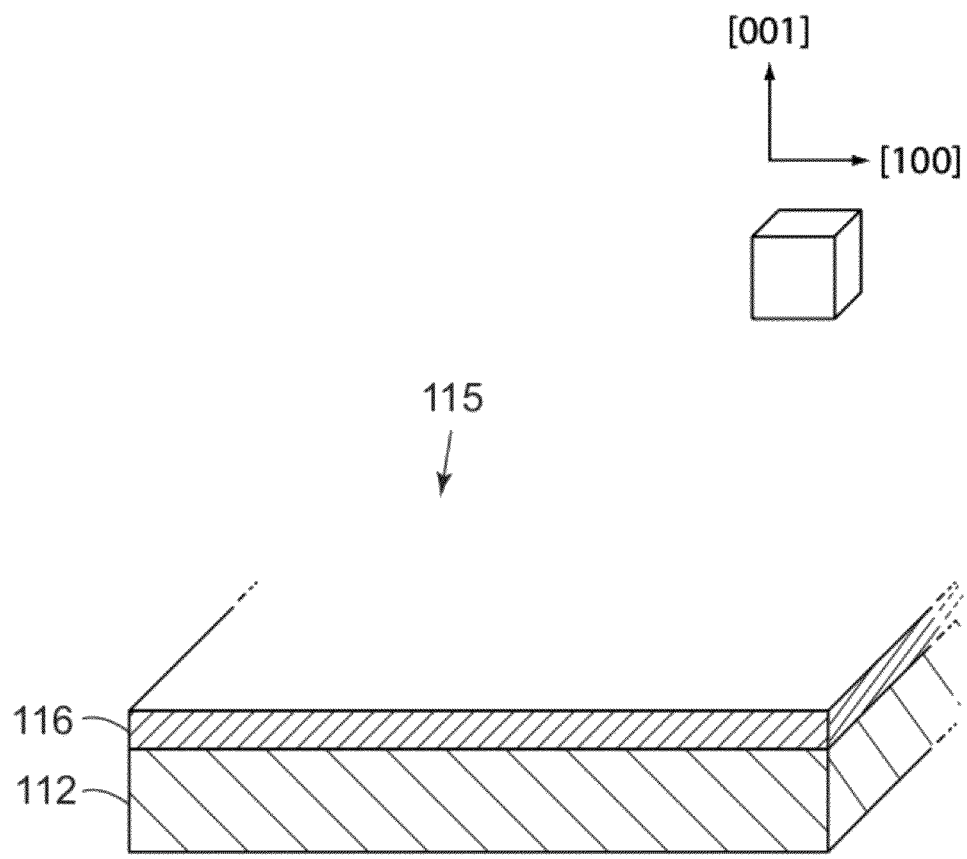
FIG. 14 is a diagram of an article after re-crystallizing by annealing and forming a cube textured surface on a composite sheet.

FIGS. 13, 14 show, in accordance with examples of the present invention, a variation in the processes described above. In this example, untextured sheets 110, 112 are provided in a Cu-type deformation state and are bonded together as taught herein so that both untextured sheets 110, 112 remain in an untextured state to form an untextured intermediate composite sheet 114. Untextured intermediate composite sheet 114 is subsequently exposed to recrystallization annealing at a temperature sufficient to re-crystallize untextured sheet 110 but not untextured sheet 112. The annealing process converts untextured sheet 110 into a cube textured sheet 116. Thus, a product composite sheet 115 is formed which comprises an untextured sheet 112 that provides a strong substrate on which textured sheet 116 is adherently supported.

Figure 15:
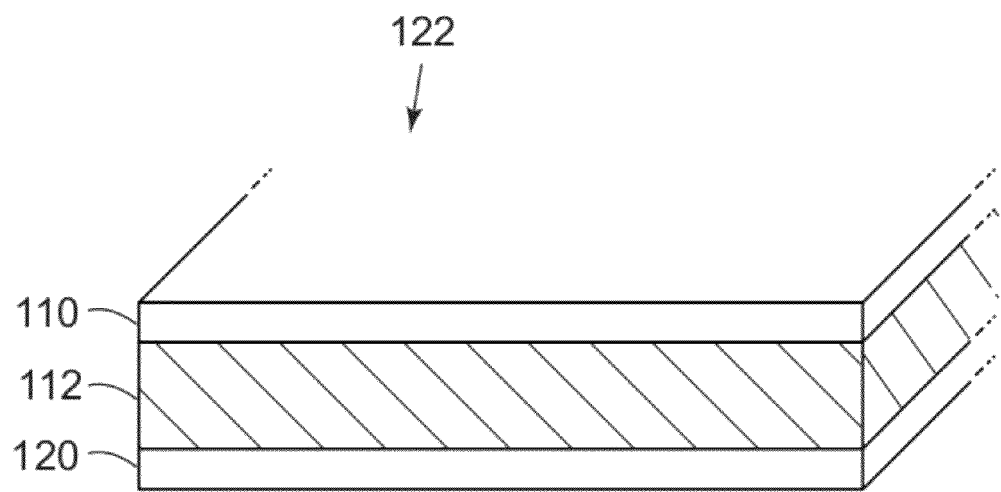
FIG. 15 is a diagram of an article before re-crystallizing by annealing and forming a cube textured surface on both sides of a composite sheet.
Figure 16:
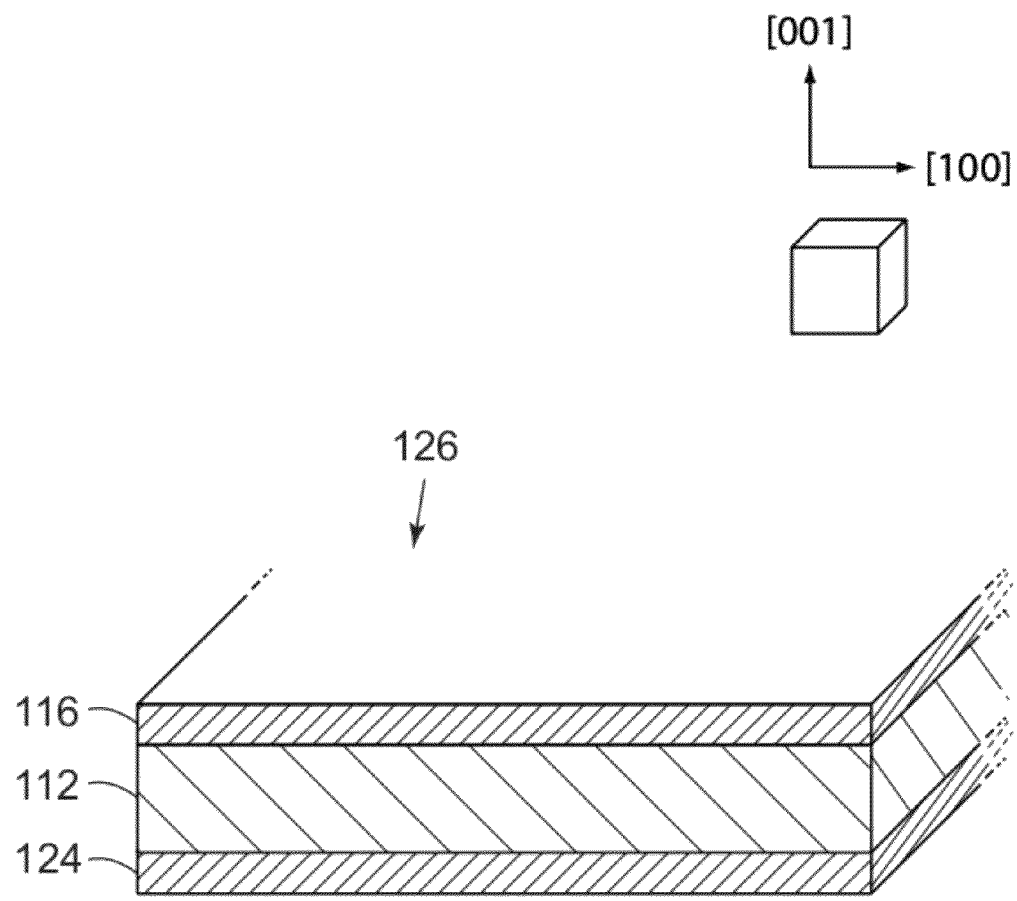
FIG. 16 is a diagram of an article after re-crystallizing by annealing and forming a cube textured surface on both sides of a composite sheet.

FIGS. 15, 16 show, in accordance with examples of the present invention, a further variation in the processes described above. In this example, untextured sheets 110, 112, 120 are provided in a Cu-type deformation state and are bonded together as taught herein so that all three untextured sheets 110, 112, 120 remain in an untextured state to form an untextured intermediate composite sheet 122. Untextured intermediate composite sheet 122 is subsequently exposed to recrystallization annealing at a temperature sufficient to re-crystallize untextured sheets 110, 120 but not untextured sheet 112. The annealing process converts untextured sheets 110, 120 into cube textured sheets 116, 124. Thus, a product composite sheet 126 comprises untextured sheet 112 that remains untextured and provides a strong substrate on which cube textured sheets 116, 124, untextured sheet 112 being sandwiched therebetween.

Figure 17:
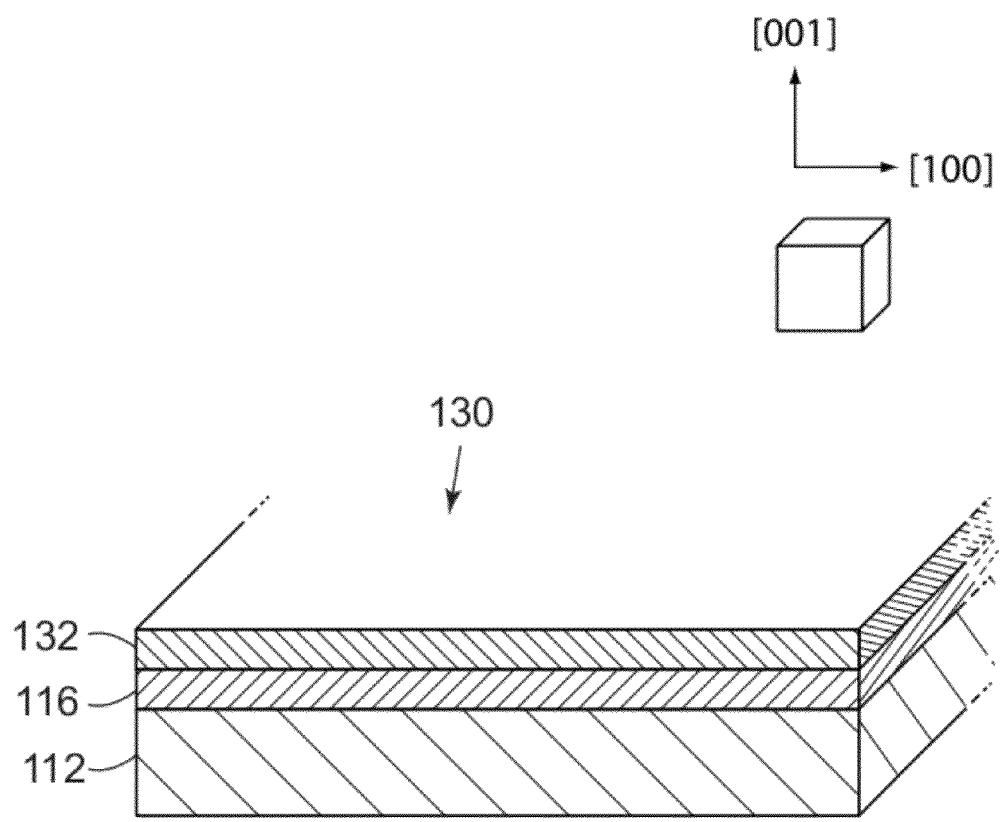
FIG. 17 is a diagram of an article having a further layer of textured material epitaxially deposited onto a composite sheet in accordance with examples of the present invention.

Further layers of textured materials can be epitaxially deposited onto composite sheets described hereinabove. Referring to FIG. 17, a product composite sheet 130 comprises an untextured sheet 112, a textured sheet 116, and additional layer 132. Further layers of additionally deposited material can be deposited onto additional layer 132. At least one of the additional layers can be an electrically active material as described hereinabove.

Figure 18:
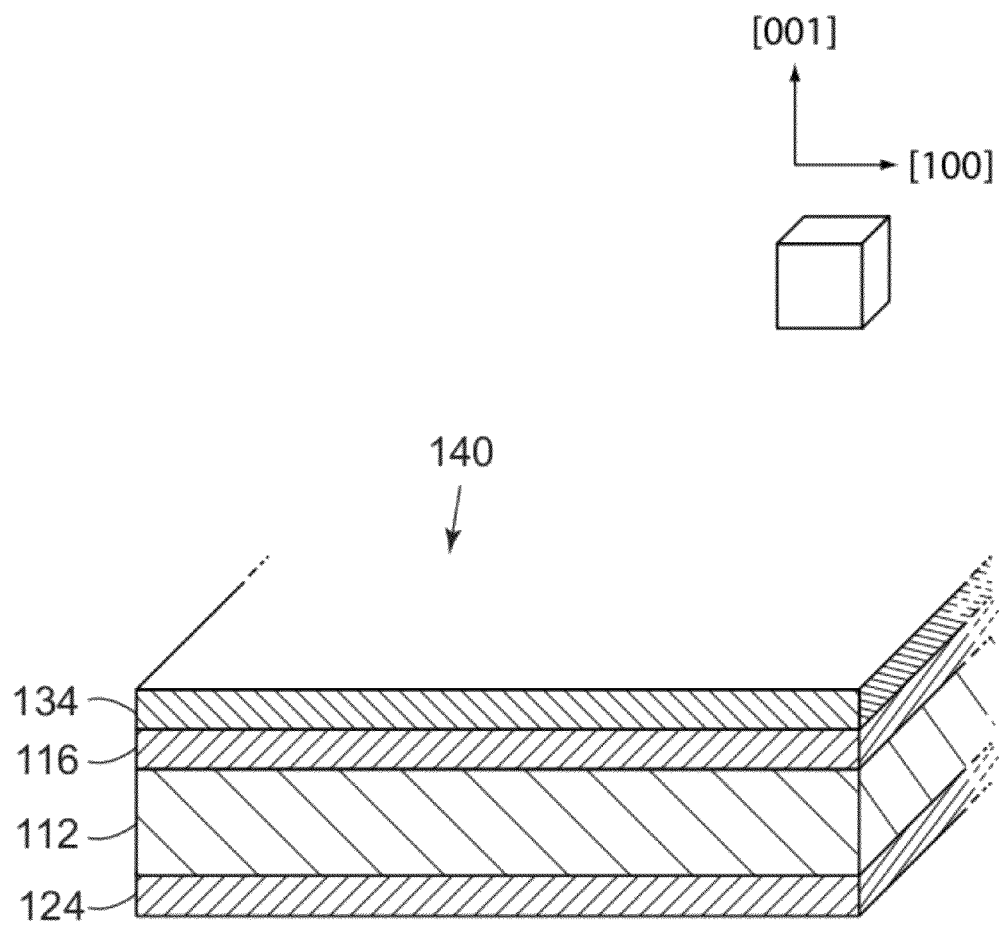
FIG. 18 is a diagram of an article having a further layer of textured material epitaxially deposited onto a composite sheet in accordance with examples of the present invention.
Figure 19:
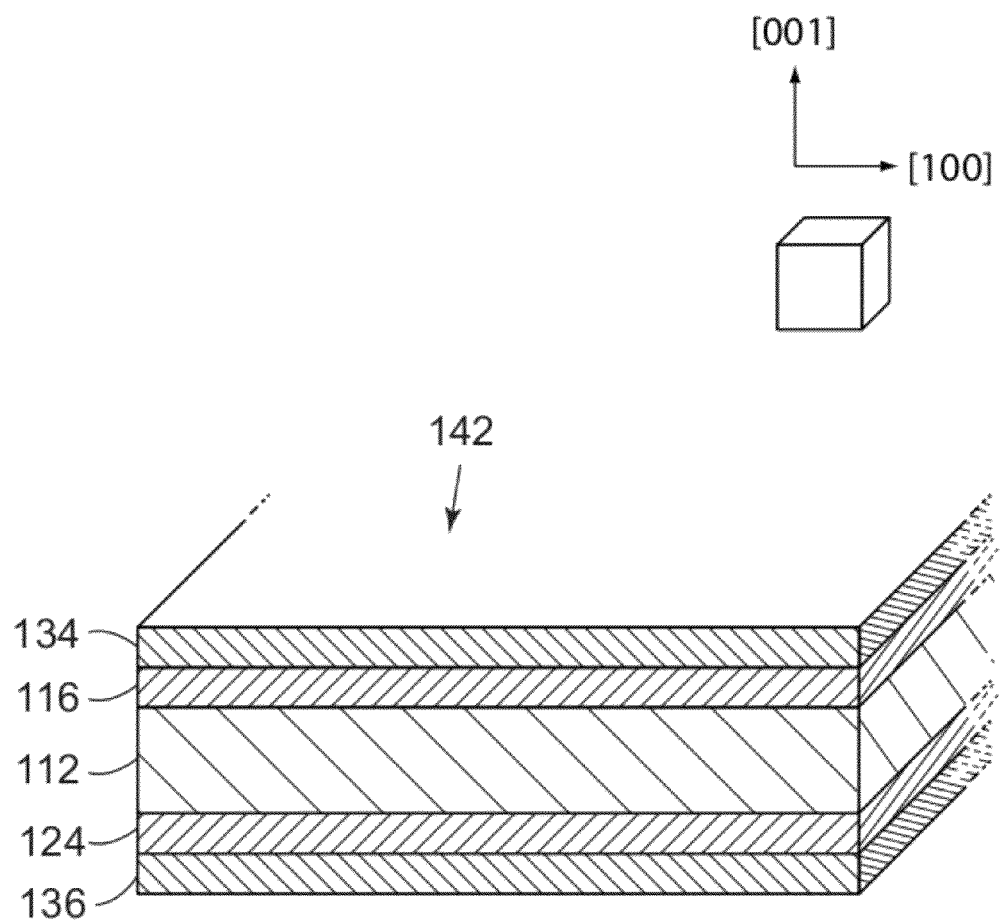
FIG. 19. is a diagram of an article having further layers of textured material epitaxially deposited onto a composite sheet in accordance with examples of the present invention.

Moreover, referring to FIG. 18, a product composite sheet 140 comprises an untextured sheet 112, textured sheets 116, 124, and additional layer 134. Further layers of additional material can be deposited onto additional layer 134. Furthermore, referring to FIG. 19, a product composite sheet 142 comprises an untextured sheet 112, textured sheets 116, 124, and additional layers 132, 136. In some applications this configuration may be desirable because of its symmetry. Further layers of additional material can be deposited onto one or both additional layers 132, 136. At least one of the additional layers can be an electrically active material as described hereinabove.

While there has been shown and described what are at present considered to be examples of the invention, it will be obvious to those skilled in the art that various changes and modifications can be prepared therein without departing from the scope of the inventions defined by the appended claims.

What is claimed is:

1. A method of forming a composite sheet comprising:
   a. providing a first sheet having a surface and comprising a metal or alloy having a cube texture characterized by a φ-scan having a FWHM of no more than 15° in all directions, the first sheet having a given strength characteristic;
   b. providing a second sheet having a surface and a strength characteristic that is superior to the given strength characteristic of the first sheet;
   c. disposing the first sheet and the second sheet in an aligned opposing position with at least a portion of the surface of the first sheet touching the surface of the first sheet to form a contact area; and
   d. bonding the first sheet to the second sheet at least in part by applying an oscillating ultrasonic force to at least one of the first sheet and the second sheet to form a composite sheet without deleteriously affecting the cube texture of the first sheet.

2. A method in accordance with claim 1 wherein the bonding step comprises:
   a. applying normal, opposing forces to the first and second sheets at a preselected magnitude and for a preselected duration to urge the first and second sheets together at the contact area; and
   b. while applying the normal, opposing forces, simultaneously applying the oscillating ultrasonic force to one of the first and second sheets at a preselected magnitude and for a preselected duration, the oscillating ultrasonic force being oriented to cause sheer forces and interfacial stress at the contact area.

3. A method in accordance with claim 1 wherein the metal has cube texture characterized by a φ-scan having a FWHM of no more than 7° in all directions.

4. A method in accordance with claim 1 further comprising an additional step of annealing the composite sheet at a temperature higher than a primary re-crystallization temperature of the first sheet to improve the bonding between the first and second sheets and to improve the cube texture so that the cube texture is characterized by a φ-scan having a FWHM of no more than 7° in all directions.

5. A method in accordance with claim 4 wherein the annealing step is carried out by at least one heating method selected from the group consisting of: resistive, radiative, contact, plasma-arc, and high density infrared.

6. A method in accordance with claim 1 wherein the oscillating ultrasonic force is applied using at least one rotating roller sonotrode.

7. A method in accordance with claim 1 wherein the oscillating ultrasonic force is applied at a sufficient magnitude and for a sufficient duration to break up an oxide layer on at least the first sheet and thereby facilitate bonding between the sheets.

8. A method in accordance with claim 1 wherein the second sheet is essentially non-magnetic.

9. A method in accordance with claim 1 wherein the second sheet is characterized by a yield strength greater than 300 megapascals.

10. A method in accordance with claim 9 wherein the composite sheet has a yield strength greater than about 250 megapascals.

11. A method in accordance with claim 1 wherein the first sheet comprises a metal or alloy that includes at least one element selected from the group consisting Ni, Fe, Al, and Cu.

12. A method in accordance with claim 11 wherein the first sheet comprises a Ni—W alloy sheet.

13. A method in accordance with claim 1 wherein the second sheet comprises at least one material selected from the group comprising Ni, Ni-alloy, Cu, Cu-alloy, Al and Al-alloy.

14. A method in accordance with claim 1 further comprising an additional step of depositing a device layer of additional material on the first sheet of the composite sheet, the device layer comprising at least one device selected from the group consisting of a superconductor, a semiconductor, a ferroelectric, a ferroic, a photovoltaic, and a piezoelectric.

15. A method in accordance with claim 1 further comprising additional steps of depositing epitaxial layers on the first sheet of the composite sheet, wherein at least one of the epitaxial layers is a device selected from the group consisting of a superconductor, a semiconductor, a ferroelectric, a ferroic, a photovoltaic, and a piezoelectric.

16. A method in accordance with claim 1 wherein the second sheet has a first surface and an opposing second surface, wherein disposition of the first sheet and the second sheet is such that a portion of the surface of the first sheet touches the first surface of the second sheet to form a first contact area, and further comprising:
  a. providing a third sheet having a surface and comprising a metal having a cube texture characterized by a φ-scan having a FWHM of no more than 15° in all directions, the third sheet having a strength characteristic that is inferior to the strength characteristic of the second sheet;
  b. disposing the third sheet and the second sheet in an aligned opposing position with at least a portion of the surface of the third sheet touching the second surface of the second sheet to form a second contact area; and wherein
  d. the bonding step includes bonding the third sheet to the second sheet at least in part by applying an oscillating ultrasonic force to at least one of the third sheet and the second sheet to form a composite sheet without deleteriously affecting the cube texture of the third sheet.

17. A method in accordance with claim 16 wherein the metal of the third sheet has cube texture characterized by a φ-scan having a FWHM of no more than 7° in all directions.

18. A method in accordance with claim 16 further comprising an additional step of annealing the composite sheet at a temperature higher than a primary re-crystallization temperature of the first and third sheets to improve the bonding between the first, second, and third sheets and to improve the cube textures of the metals of the first and third sheets so that the cube textures are each characterized by a φ-scan having a FWHM of no more than 7° in all directions.

19. A method in accordance with claim 16 wherein the third sheet comprises a metal or alloy that includes at least one element selected from the group consisting Ni, Fe, Al, and Cu.

20. A method in accordance with claim 19 wherein the third sheet comprises a Ni—W alloy sheet.

21. A method in accordance with claim 16 further comprising an additional step of depositing a device layer of additional material on the third sheet of the composite sheet, the device layer comprising at least one device selected from the group consisting of a superconductor, a semiconductor, a ferroelectric, a ferroic, a photovoltaic, and a piezoelectric.

22. A method in accordance with claim 16 further comprising additional steps of depositing epitaxial layers on the third sheet of the composite sheet, wherein at least one of the epitaxial layers is a device selected from the group consisting of a superconductor, a semiconductor, a ferroelectric, a ferroic, a photovoltaic, and a piezoelectric.

* * * * *

UNITED STATES PATENT AND TRADEMARK OFFICE
CERTIFICATE OF CORRECTION

PATENT NO. : 8,210,420 B1  
APPLICATION NO. : 13/020032  
DATED : July 3, 2012  
INVENTOR(S) : Craig A. Blue and Amit Goyal Page 1 of 1

It is certified that error appears in the above-identified patent and that said Letters Patent is hereby corrected as shown below:

On the Title Page, Item (57) Abstract, line 8, "touching the surface of the first" should be --touching the surface of the second--.

In the Specifications:

Column 1, lines 50 and 62, each instance of "touching the surface of the first" should be --touching the surface of the second--.

Column 4, lines 59-60, 61-62, 64, and 65-66, each instance of "oscillating force 32" should be --oscillating force 22--.

Column 4, lines 62 and 64, each instance of "sheet 22" should be --sheet 12--.

Column 4, lines 65, "sheet 20" should be --sheet 10--.

Column 5, lines 1-2, "oscillating force 32" should be --oscillating force 22--.

In the Claims:

Column 8, line 46, "touching the surface of the first" should be --touching the surface of the second--.

Signed and Sealed this  
Fourteenth Day of May, 2013

Teresa Stanek Rea  
*Acting Director of the United States Patent and Trademark Office*